United States Patent
Krames et al.

(10) Patent No.: US 6,683,327 B2
(45) Date of Patent: Jan. 27, 2004

(54) NUCLEATION LAYER FOR IMPROVED LIGHT EXTRACTION FROM LIGHT EMITTING DEVICES

(75) Inventors: Michael R. Krames, Mountain View, CA (US); Tetsuya Takeuchi, Sunnyvale, CA (US); Junko Kobayashi, Sunnyvale, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/993,862

(22) Filed: Nov. 13, 2001

(65) Prior Publication Data

US 2003/0089917 A1 May 15, 2003

(51) Int. Cl.[7] .............................................. H01L 29/227
(52) U.S. Cl. ........................ 257/98; 257/101; 257/190
(58) Field of Search .......................... 257/98, 101, 190

(56) References Cited

U.S. PATENT DOCUMENTS

| | | | | |
|---|---|---|---|---|
| 5,393,993 | A | 2/1995 | Edmond et al. | 257/77 |
| 5,585,648 | A | 12/1996 | Tischler | 257/77 |
| 5,661,074 | A | 8/1997 | Tischler | 438/32 |
| 5,903,017 | A | * 5/1999 | Itaya et al. | 257/190 |
| 5,990,496 | A | * 11/1999 | Kunisato et al. | 257/94 |
| 6,177,292 | B1 | * 1/2001 | Hong et al. | 438/46 |
| 6,215,803 | B1 | * 4/2001 | Hata | 372/46 |
| 6,229,151 | B1 | * 5/2001 | Takeuchi et al. | 257/14 |
| 6,303,473 | B1 | * 10/2001 | Heffernan et al. | 438/483 |
| 2001/0038656 | A1 | * 11/2001 | Takeuchi et al. | 372/45 |

FOREIGN PATENT DOCUMENTS

| | | | | |
|---|---|---|---|---|
| JP | 10-27947 | 1/1998 | | |
| JP | 10-270368 | 10/1998 | | |
| JP | 11-40893 | 2/1999 | | |
| JP | 11-97803 | * 4/1999 | | H01S/3/18 |
| JP | 11-112029 | * 4/1999 | | H01L/33/00 |
| JP | 2000-40858 | 2/2000 | | |
| JP | 2000-68498 | 3/2000 | | |
| JP | 2000-196143 | 7/2000 | | |
| WO | WO 99/10936 | 3/1999 | | |

OTHER PUBLICATIONS

L. B. Rowland et al., "*Aluminum nitride/silicon carbide multilayer heterostructure produced by plasma–assisted, gas–source molecular beam epitaxy*," Appl. Phys. Lettt. 62(25), Jun. 21, 1993, pp. 3333–3335.

F.A. Ponce et al., "*Microstructure of GaN epitaxy on SiC using AlN buffer layers*," Appl. Phys. Lett 67(3), Jul. 17, 1995, pp. 410–412.

K. Horino et al., "*Initial Growth Stage of AlGaN Grown Directly on (0001) 6H–SiC by MOVPE*," Mat. Res. Soc. Symp. Proc. Vol 449, pp. 73–78.

(List continued on next page.)

Primary Examiner—Eddie Lee
(74) Attorney, Agent, or Firm—Patent Law Group LLP; Rachel V. Leiterman

(57) ABSTRACT

A light emitting device including a nucleation layer containing aluminum is disclosed. The thickness and aluminum composition of the nucleation layer are selected to match the index of refraction of the substrate and device layers, such that 90% of light from the device layers incident on the nucleation layer is extracted into the substrate. In some embodiments, the nucleation layer is AlGaN with a thickness between about 1000 and about 1200 angstroms and an aluminum composition between about 2% and about 8%. In some embodiments, the nucleation layer is formed over a surface of a wurtzite substrate that is miscut from the c-plane of the substrate. In some embodiments, the nucleation layer is formed at high temperature, for example between 900° and 1200° C. In some embodiments, the nucleation layer is doped with Si to a concentration between about $3e18$ $cm^{-3}$ and about $5e19$ $cm^{-3}$.

26 Claims, 3 Drawing Sheets

OTHER PUBLICATIONS

C. F. Lin et al.,"*Growth and characterizations of GaN on SiC substrates with buffer layers,*" J. Appl. Phys. 82(5), Sep. 1, 1997, pp. 2378–2382.

Yuichiro Kuga et al., "*Violet and Near–UV Light Emission for GaN/$Al_{0.08}Ga_{0.92}N$ Injection Diode Grown on (0001) 6H–SiC Substrate by Low–Pressure Metal–Organic Vapor Phase Epitaxy,*" Jpn. J. Appl. Phys. vol. 34 (1995), Part 1, No. 8A, Aug. 1995, pp. 4085–4086.

T. Warren Week Jr., et al., "*GaN thin films deposited via organometallic vapor phase epitaxy on $\propto(6H)$–SiC(0001) using high–temperature monocrystalline AlN buffer layers,*" Appl. Phys. Lett. 67(3), Jul. 17, 1995, pp. 401–403.

J. A. Smart et al., "*AlGaN/GaN heterostructures on insulating AlGaN nucleation layers,*" Applied Physics Letters, vol. 75, No. 3, Jul. 19, 1999, pp. 388–390.

J.A. Smart et al., "*Single step process for epitaxial lateral overgrowth of GaN on SiC and sapphire substrates,*" Applied Physics Letters, vol. 75, No. 24, Dec. 13, 1999, pp. 3820–3822.

A.D. Hanser et al., "*B2.2 SiC substrates for growth of GaN and related compounds,*" Source unknown, May 1998, pp. 386–390.

\* cited by examiner

NUCLEATION LAYER FOR IMPROVED LIGHT EXTRACTION FROM LIGHT EMITTING DEVICES

BACKGROUND

Semiconductor light-emitting diodes (LEDs) are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen, also referred to as III-nitride materials. In general, the III-nitride device layers in an LED must be epitaxial in order for the LED to function at a useful efficiency. III-nitride devices are grown by metal-organic chemical vapor deposition (MOCVD), molecular beam epitaxy (MBE), or other epitaxial techniques. The substrate on which a crystal is grown greatly influences the epitaxial growth mechanism and quality of the crystal. In order to grow III-nitride crystal layers of sufficient quality for use in an LED, the crystal lattice parameters of the substrate must be identical to or closely match the crystal lattice parameters of the epitaxial layers. Typically, III-nitride LEDs are grown on sapphire, SiC, or GaN substrates. Both sapphire and SiC are mismatched from the GaN, sapphire by 15% and SiC by 3.5%. III-nitride LEDs structures are often grown on sapphire substrates due to sapphire's high temperature stability and relative ease of production.

The use of a sapphire substrate may lead to poor extraction efficiency due to the large different in index of refraction at the interface between the semiconductor layers and the substrate. When light is incident on an interface between two materials, the difference in index of refraction determines how much light is reflected at that interface, and how much light is transmitted through it. The larger the difference in index of refraction, the more light is reflected. The refractive index of sapphire (1.8) is low compared to the refractive index of the III-nitride device layers (2.4) grown on the sapphire. Thus, a large portion of the light generated in the III-nitride device layers is reflected when it reaches the interface between the semiconductor layers and a sapphire substrate. The reflected light must scatter and make many passes through the device before it is extracted. These many passes result in significant attenuation of the light due to optical losses at contacts, free carrier absorption, and interband absorption within any of the III-nitride device layers.

The index of refraction of SiC (2.7) more closely matches the index of refraction of the III-nitride device layers. However, as described above, sapphire and SiC have a lattice mismatch from GaN. As a result of the lattice mismatch, buffer or nucleation layers which are optimized for lattice matching and coefficient of thermal expansion matching between the substrate and the III-nitride device layers are typically grown on the substrate before the III-nitride device layers. FIG. 1 shows an example of buffer layers used on SiC substrates, described in U.S. Pat. No. 5,393,993. A three layer buffering structure comprising layers 26, 22, and 23 is formed between the SiC substrate 25 and the epitaxial GaN layer 24. The layer immediately adjacent to the SiC substrate is AlN. This AlN buffer layer, which has an index of refraction of about 2.0, reduces most of the light extraction benefit that may be derived from the use of SiC.

SUMMARY

In accordance with the invention, a light emitting device includes a nucleation layer containing aluminum. The thickness and aluminum composition of the nucleation layer are selected such that 90% or more of light from the device layers incident on the nucleation layer is extracted into the substrate. In some embodiments, the nucleation layer is AlGaN with a thickness between about 600 and about 2000 angstroms and an aluminum composition between about 2% and about 8%. In some embodiments, the nucleation layer is formed over a surface of a wurtzite substrate that is miscut from the c-plane of the substrate. In such embodiments, the substrate may be slightly miscut, for example by between 0° and 5° from the c-plane, or the substrate may be largely miscut, for example by between 30° and 50°, 80° and 100°, or 130° and 150° from the c-plane. In some embodiments, the nucleation layer is formed at high temperature, for example between 900° and 1200° C. In some embodiments, the nucleation layer is doped with Si to a concentration between about 3e18 $cm^{-3}$ and about 5e19 $cm^{-3}$.

DETAILED DESCRIPTION

Figure 2:
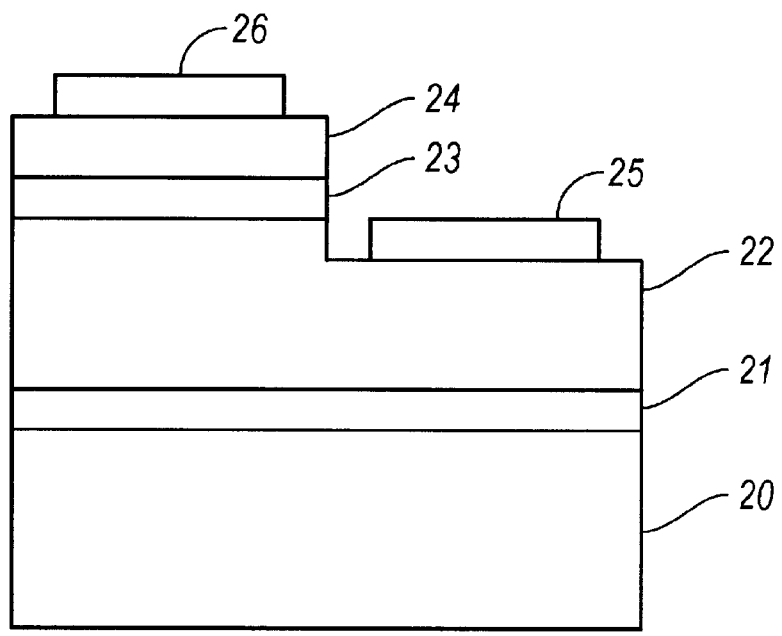
FIG. 2 illustrates an LED incorporating a nucleation layer according to the present invention.

In accordance with one embodiment of the invention, a nucleation layer grown on a substrate before III-nitride device layers is optimized for both light extraction into the substrate and surface morphology of the layers grown over the nucleation layer. FIG. 2 illustrates a device incorporating a nucleation layer according to an embodiment of the present invention. Nucleation layer 21 is formed on substrate 20. Substrate 20 has a refractive index greater than 2. Examples of substrates with suitable indices of refraction are SiC and ZnO, which has an index of refraction of about 2.3. Substrate 20 is also selected such that the lattice mismatch between the substrate and wurtzite GaN crystal layers is less than 5%. Examples of substrates with suitably close lattice matches with GaN are SiC and $MgScAl_2O_4$. All hexagonal polytypes of SiC are suitable for use with the present invention. In addition, the lattice match between cubic polytypes of SiC and cubic GaN-based layers is also suitably close.

One or more n-type layers 22 are formed over nucleation layer 21. N-type layers 22 may include, for example, an undoped GaN layer, an n-type contact layer, and an n-type cladding layer. N-type layers 22 are usually doped with Si. An active region 23 is formed over n-type layers 22. Active region 23 generally includes one or more quantum wells separated by barrier layers. One or more p-type layers 24 are formed over active region 23. P-type layers are usually doped with Mg.

If substrate 20 is insulating or poorly conducting, both p-contact 26 and n-contact 25 are formed on the same side of the device. Generally portions of p-type layers 24 and active region 23 are etched away to expose the portion of n-type layers 22 on which n-contact 25 is deposited. If substrate 20 is conducting, the n-contact may be deposited on the underside of substrate 20. However, devices fabricated on conducting substrates may also be designed to have both contacts on the same side of the device on which the epitaxial material is grown so as to improve light extraction from the LED chip, to improve the current carrying capacity of the chip, or to improve the heat sinking of the LED die. There are two types of devices with both the p- and n-contacts formed on the same side. In the first, referred to as a flip chip, the light is extracted through the substrate. In the second, the light is extracted through the contacts, which are formed on the epitaxial side of the device.

Nucleation layer 21 is typically AlGaN. The thickness, Al composition, dopant concentration, and fabrication temperature of nucleation layer 21 are each selected such that nucleation layer 21 both enhances the light extraction of the device by having an index of refraction close to that of the substrate and the device layers, and causes favorable surface properties in the layers grown over nucleation layer 21. The quality of the surface of the layers of a device can impact the total light output and quantum efficiency. Thus, imparting favorable surface properties in the layers grown over nucleation layer 21 may enhance LED performance. In some embodiments, the properties of nucleation layer 21 are selected such that at least 90% of the light incident on nucleation layer 21 is extracted into substrate 20 and such that the RMS roughness of the layers grown over the nucleation layer does not exceed 5 nm in a 10 micron by 10 micron scan area.

Figure 1:
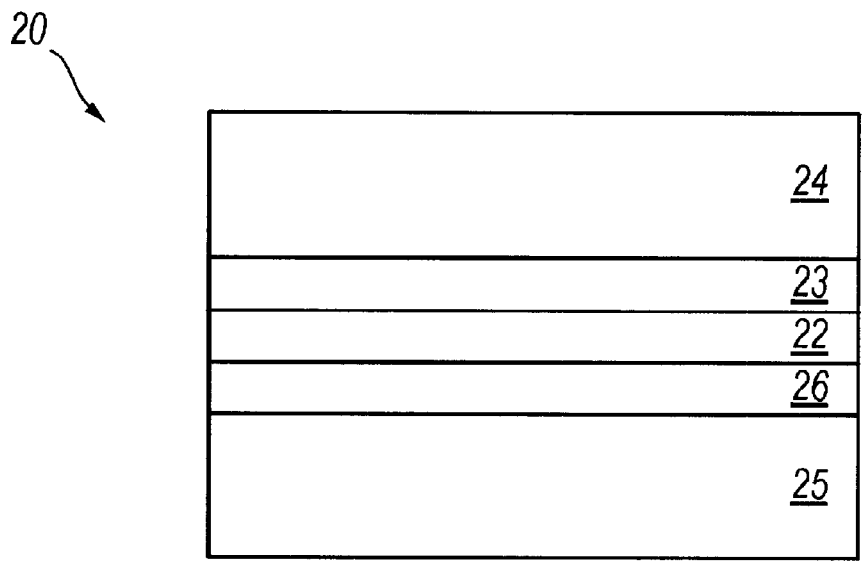
FIG. 1 illustrates a prior art buffer structure for use in a III-nitride device formed on a SiC substrate.
Figure 3:
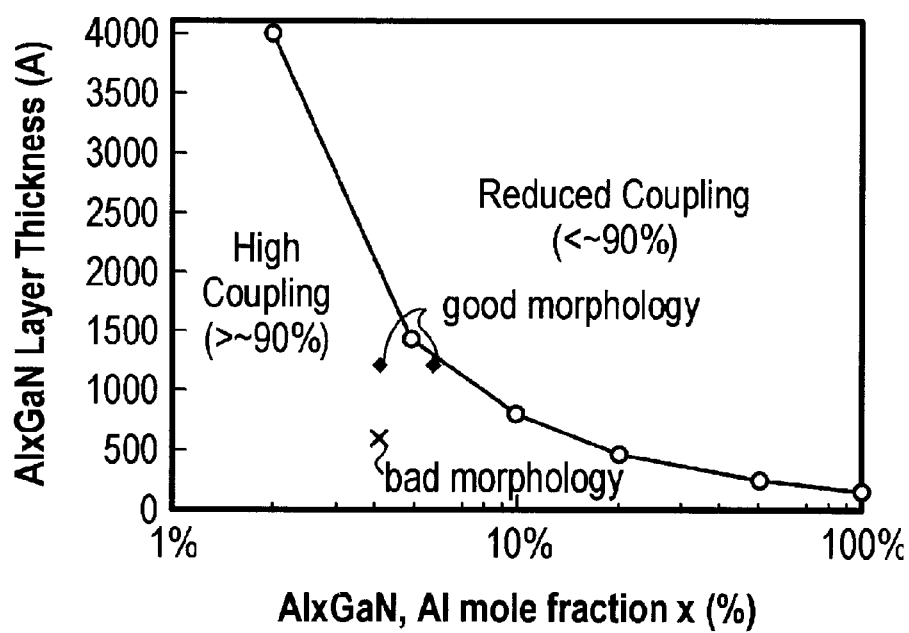
FIG. 3 illustrates the relative light extraction efficiency of devices of a given nucleation layer thickness and composition.

Nucleation layer 21 must have a minimum amount of Al to avoid three-dimensional island growth, which can unfavorably impact LED performance by causing poor surface morphology in the layers grown over nucleation layer 21. However, as Al composition increases, index of refraction of the layer decreases. FIG. 3 illustrates the Al composition and thickness of an AlGaN nucleation layer that is optimized to extract at least 90% of the light emitted from the III-nitride device layers incident on the interface between the nucleation layer and the III-nitride device layers. The curve in FIG. 3 illustrates the boundary between layers with greater than 90% extraction (the region below the curve) and layers with less than 90% extraction (the region above the curve). The composition of Al in the nucleation layer is usually between about 2% and about 8%. In some embodiments, the composition of Al is between about 4% and about 6%. Nucleation layer 21 usually has a nominally constant composition, though as nucleation layer 21 starts forming on substrate 20, Al atoms "stick" to the substrate surface, causing a higher composition of Al adjacent to the substrate. For example, the first 50 angstroms in a 1200 angstrom layer may have higher Al composition than the remaining 1150 angstroms.

Table 1 illustrates the index of refraction of various $Al_xGa_{1-x}N$ layers. In some embodiments, nucleation layer 21 has an index of refraction greater than about 2.3.

TABLE 1

| Aluminum composition (x) | Index of Refraction |
| --- | --- |
| 0 | 2.43 (GaN) |
| 0.02 | 2.42 |
| 0.05 | 2.41 |
| 0.1 | 2.39 |
| 0.2 | 2.35 |
| 0.5 | 2.24 |
| 1 | 2.06 (AlN) |

The appropriate thickness of nucleation layer 21 is related to the Al composition, as illustrated in FIG. 3. A nucleation layer with a high composition of Al must be very thin, for example less than 200 angstroms thick, in order to extract at least 90% of the light incident on the nucleation layer. For reduced Al compositions, the allowable thickness increases. In some embodiments, the thickness of nucleation layer 21 may be between about 600 and about 2000 angstroms, and is usually between about 1000 and about 1200 angstroms. Nucleation layer thickness is also related to the LED performance and surface properties of layers grown over nucleation layer 21. As the thickness of nucleation layer 21 decreases, the ability of nucleation layer 21 to impart favorable surface morphology and favorable LED performance to the layers grown over nucleation layer 21 also decreases. Thus, the optical properties of the nucleation layer place an upper bound on Al composition, while the LED performance and surface properties of layers grown over the nucleation layer place a lower bound on nucleation layer thickness and a lower bound on Al composition.

Nucleation layer 21 may be doped with an n-type dopant such as Si or a p-type dopant such as Mg. The concentration of dopant in nucleation layer 21 does not have a large effect on the index of refraction of nucleation layer 21, but too large a dopant concentration can strain the crystal structure of nucleation layer 21, which can adversely impact the quality of the layers grown over nucleation layer 21. Usually, nucleation layer 21 is doped with Si to a nominally constant concentration of $3e18$ $cm^{-3}$ to $5e19$ $cm^{-3}$. Nucleation layer 21 may also have a graded dopant concentration.

The temperature at which nucleation layer 21 is grown may influence the surface morphology of the device layers grown over the nucleation layer. Nucleation layer 21 is grown at high temperature, for example between 900° C. and 1200° C. In some embodiments, nucleation layer 21 is grown between 1080° C. and 1165° C. Nucleation layer 21 may be grown at the same temperature as the GaN layer formed over nucleation layer 21, in order to simplify fabrication. GaN may be grown at, for example, 1080° C.

Table 2 illustrates three examples of nucleation layers formed on SiC substrates.

TABLE 2

| Example | 1 | 2 | 3 |
| --- | --- | --- | --- |
| Al composition | 4% | 6% | 4% |
| Si concentration | $3e18$ $cm^{-3}$ | $3e18$ $cm^{-3}$ | $3e18$ $cm^{-3}$ |
| Thickness | 1200 Å | 1200 Å | 600 Å |
| Growth temp. | 1080° C. | 1050° C. | 1050° C. |
| Crystal Quality | Good | Good | Poor |

After nucleation layer 21 was formed for each example, device layers such as those shown in FIG. 2 were fabricated over each nucleation layer. Examples 1 and 2 both yielded device layers with good surface morphology. Example 3 yielded device layers with poor surface morphology and poor device performance. Examples 1 and 2 are represented on FIG. 3 by diamonds. Example 3 is represented on FIG. 3 by an X.

Figure 4:
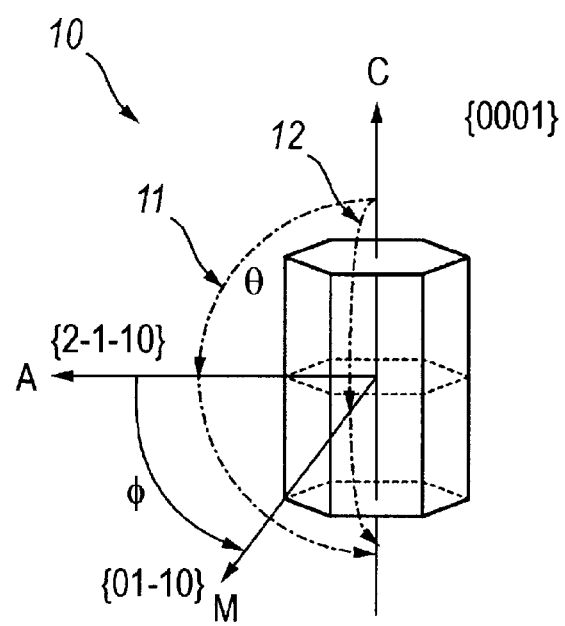
FIG. 4 illustrates the crystal structure of a wurtzite GaN-based semiconductor.

In some embodiments of the invention, nucleation layers are grown on substrates that are miscut from the major crystallographic planes on which light emitting devices are usually grown. FIG. 4 illustrates a wurtzite crystal structure 10. III-nitride light emitting devices are often grown on the c-plane of wurtzite crystal substrates such as sapphire and SiC. It has been observed that growing III-nitride layers on substrates that are slightly miscut from the c-plane in the direction of the m-plane or the a-plane yield light emitting devices that more efficiently generate light. The growth of III-nitride devices on slightly miscut substrates is described in more detail in application Ser. No. 09/797,770, titled "Increasing The Brightness Of III-Nitride Light Emitting Devices," filed on Mar. 1, 2001 on an invention of Khare et al., and incorporated herein by reference. In some embodiments of the present invention, nucleation layer 21 is grown on a substrate that is miscut from the C plane by between 0° and about 5°, usually between 0° and about 1°.

Normal GaN-based crystal layers typically have large polarization fields, caused by the different electronegativities of the atoms in the crystal and the assymetric nature of wurtzite. Polarization fields in the device layers of a light emitting device can undesirably tilt the energy bands of the layers in the device, which can decrease the efficiency of the device. In general, as the polarization fields in a quantum well layer of a device increase, the efficiency decreases. The polarization field in a layer has at least two components, a piezoelectric field and a spontaneous electric field.

Figure 5:
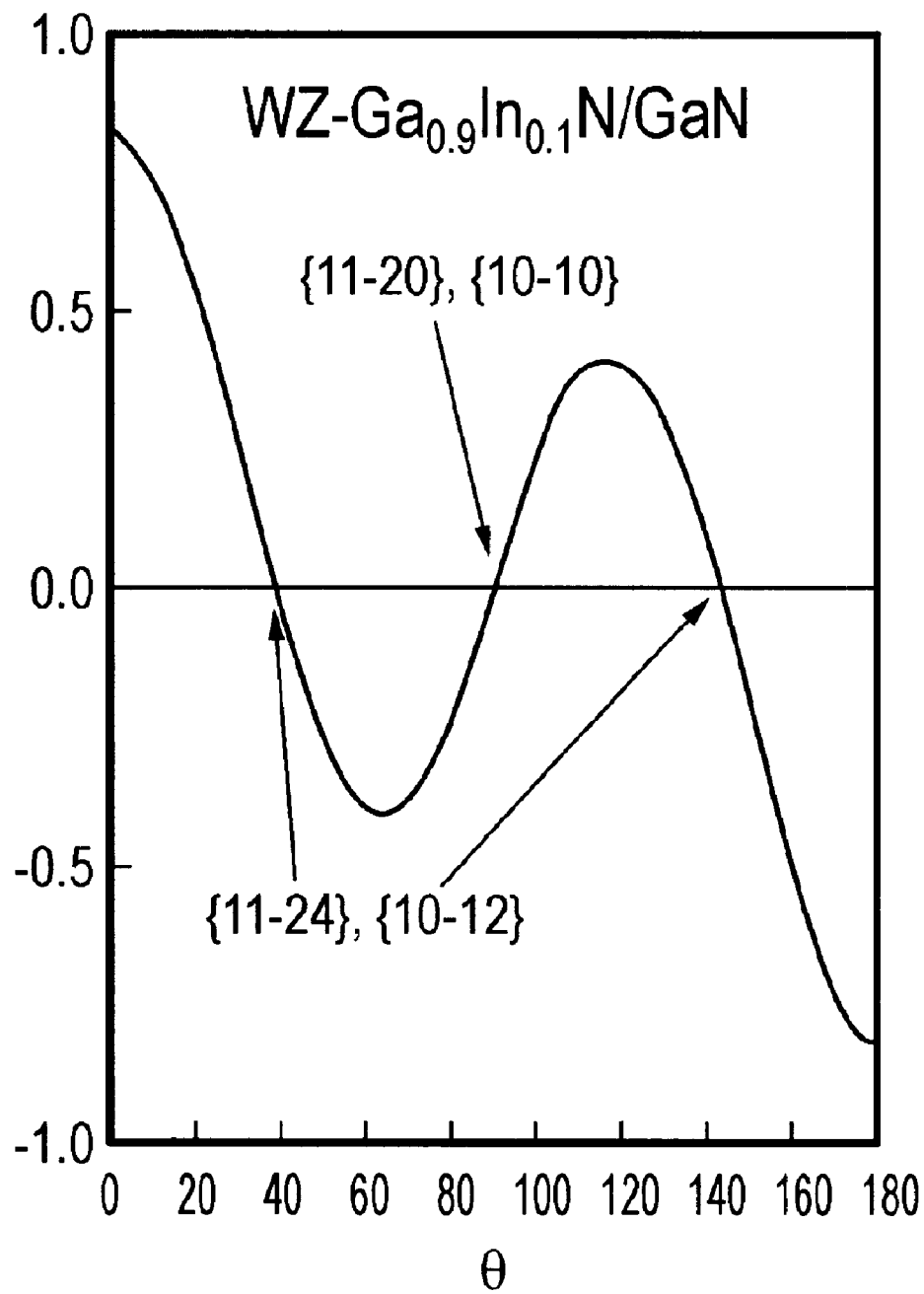
FIG. 5 is a graph of the piezoelectric field generated in the quantum well as a function of growth orientation for a wurtzite GaN-based semiconductor.

The piezoelectric field generated in a crystal having a facet orientation along arc 11 in FIG. 4 is shown in FIG. 5 as a function of the angle θ between the {0001} direction and the facet orientation. The data shown in FIG. 5 is for $Ga_{0.9}In_{0.1}N$ strained quantum well layers. The piezoelectric field reaches maxima in the {0001} direction or the {000-1} direction, and has three orientations at which the piezoelectric field is zero. The same result is obtained for other arcs, e.g., arc 12. That is, the piezoelectric field is uniquely determined by the difference in the angle between the {0001} direction and the facet orientation of the concerned plane, i.e., the piezoelectric field is independent of Φ.

Hence it is clear from FIG. 5 that there are several sets of planes for which there is no piezoelectric field: the planes at 90° to the c-axis such as, for example, the a-plane, {2-1-10} and the m-plane {0-110}; and the planes around 40° and 140° to the c-axis, for example the planes {2-1-14} and {01-12}.

The strength of the piezoelectric field depends on the strain in and the composition of the InGaN strained quantum well layer. However, the 90° facet orientation measured from the {0001} direction where the piezoelectric field becomes zero does not strongly depend on the ratio of Ga to In. In addition, for typical InGaN quantum well LEDs the plane orientations corresponding to the 40° and 140° orientations discussed above typically change by no more than about of 5° from the 40° and 140° values determined for the composition shown in FIG. 5.

Like the polarization field, the strength of the spontaneous electric field in a wurtzite crystal structure III-nitride quantum well layer also depends on the facet orientation of the quantum well layer, and hence the spontaneous electric field can also be minimized by controlling the facet orientation. For example, the spontaneous electric field approaches zero for a III-nitride quantum well layer having approximately an a-plane or approximately an m-plane facet orientation. Such facet orientations are tilted at angles of, for example, about 80° to about 90° with respect to the {0001} direction of the wurtzite crystal structure.

The strength of the spontaneous electric field also depends on the composition of the quantum well layer and on the composition of its adjacent layers. For the case of $Ga_{0.9}In_{0.1}N$ quantum well layers between GaN layers (as considered in FIG. 5, for example), the piezoelectric field is typically much larger than the spontaneous electric field. Hence, in this case the combination of the piezoelectric and spontaneous electric fields is dominated by the piezoelectric field, and it may be advantageous to select a facet orientation that minimizes the piezoelectric field. For quantum well layers or adjacent layers formed from other III-nitride compositions, such as materials including aluminum, for example, the spontaneous electric field may be comparable to or even dominate the piezoelectric field. If the spontaneous electric field dominates the piezoelectric field, it may be advantageous to select a facet orientation that minimizes the spontaneous electric field. If the piezoelectric and spontaneous electric fields are comparable, it may be advantageous to select a facet orientation that minimizes the combined field but does not necessarily minimize either the spontaneous or piezoelectric fields separately.

Accordingly, in some embodiments of the invention, nucleation layers are grown on substrates selected to reduce polarization fields. Usually these substrates are miscut from the c-plane by about 40°, 90° or 140°. In embodiments using largely-miscut substrates, nucleation layer 21 must be grown at a temperature sufficiently high that the crystal structure of layer 21 substantially replicates that of the surface of substrate 20 on which layer 21 is grown. The fabrication of light emitting devices grown on substrates miscut from the c-plane by 40°, 90°, and 140° in order to reduce polarization fields in the device is described in more detail in application Ser. No. 09/992,192, titled "Nitride Semiconductor Device With Reduced Piezoelectric Field," filed on the same day as this application on an invention of Krames et al., and incorporated herein by reference.

Various modifications to the present invention will become apparent to those skilled in the art from the foregoing description and accompanying drawings. Accordingly, the present invention is to be limited solely by the scope of the following claims.

We claim:

1. A light emitting device comprising:
    a substrate;
    a nucleation layer comprising aluminum overlying the substrate, the nucleation layer having an aluminum composition less than or equal to about 8%; and
    a plurality of III-nitride device layers including at least one light emitting layer, the plurality of III-nitride device layers overlying the nucleation layer;
    wherein an aluminum composition and a thickness of the nucleation layer are selected such that at least 90% of light from the device layers incident on the nucleation layer is extracted into the substrate; and
    wherein one of the plurality of device layers has an RMS roughness less than 5 nm.

2. The light emitting device of claim 1 wherein an effective lattice mismatch between the substrate and one of the plurality of III-nitride device layers is less than 5%.

3. The light emitting device of claim 1 wherein the substrate is SiC.

4. The light emitting device of claim 1, wherein the substrate has a wurtzite crystal structure and the nucleation layer overlies a facet of the substrate having an orientation between 0° and 5° from the {0001} direction of the wurtzite crystal structure.

5. The light emitting device of claim 1, wherein the substrate has a wurtzite crystal structure and the nucleation layer overlies a facet of the substrate having an orientation tilted from the {0001} direction of the wurtzite crystal structure at an angle selected from the group consisting of about 30° to about 50°, about 80° to about 100°, and about 130° to about 150°.

6. The light emitting device of claim 1 wherein the nucleation layer is AlGaN having an Al composition between about 2% and about 8%.

7. The light emitting device of claim 1 wherein the nucleation layer is AlGaN having an Al composition between about 4% and about 6%.

8. The light emitting device of claim 1 wherein the nucleation layer has a thickness between about 1000 and about 1200 angstroms.

9. The light emitting device of claim 1 wherein the nucleation layer has a thickness between about 600 and about 2000 angstroms.

10. The light emitting device of claim 1 wherein the nucleation layer is doped with Si to a concentration of about $3e18$ cm$^{-3}$ to about $5e19$ cm$^{-3}$.

11. The device of claim 1 wherein one of the plurality of device layers has an RMS roughness less than 5 nm in a 10 micron by 10 micron scan area.

12. A light emitting device comprising:
    a substrate having an index of refraction greater than 2;
    an AlGaN nucleation layer formed on the substrate, the AlGaN nucleation layer having an Al composition between 2% and 8% and a thickness between 600 and 2000 angstroms, positioned at a distance less than 100 angstroms from the substrate; and
    a plurality of III-nitride device layers including an active region overlying the nucleation layer.

13. The light emitting device of claim 12 wherein the nucleation layer has a refractive index greater than 2.3.

14. The light emitting device of claim 12 wherein a lattice mismatch between the substrate and one of the plurality of III-nitride device layers is less than 5%.

15. The light emitting device of claim 12 wherein the substrate is SiC.

16. The light emitting device of claim 12 wherein the nucleation layer is doped with Si to a concentration of about $3e18$ cm$^{-3}$ to about $5e19$ cm$^{-3}$.

17. The light emitting device of claim 12 wherein the nucleation layer is AlGaN having an Al composition between about 4% and about 6%.

18. The light emitting device of claim 12 wherein the nucleation layer has a thickness between about 1000 and about 1200 angstroms.

19. The light emitting device of claim 12, wherein the substrate has a wurtzite crystal structure and the nucleation layer overlies a facet of the substrate having an orientation between 0° and 5° from the {0001} direction of the wurtzite crystal structure.

20. The light emitting device of claim 12, wherein the substrate has a wurtzite crystal structure and the nucleation layer overlies a facet of the substrate having an orientation tilted from the {0001} direction of the wurtzite crystal structure at a angle selected from the group consisting of about 30° to about 50°, about 80° to about 100°, and about 130° to about 150°.

21. A method of forming a light emitting device, the method comprising:
    providing a substrate;
    forming a nucleation layer comprising aluminum overlying the substrate, the nucleation layer having an aluminum composition less than or equal to about 8%; and
    forming a plurality of III-nitride device layers including an active region overlying the nucleation layer;
    wherein a thickness and aluminum composition of the nucleation layer are selected such that 90% of light from the device layers incident on the nucleation layer is extracted into the substrate; and
    wherein one of the plurality of device layers has an RMS roughness less than 5 nm.

22. The method of claim 21 wherein forming a nucleation layer comprises forming an AlGaN layer by metal-organic chemical vapor deposition at a temperature between about 900° and about 1200° C.

23. The method of claim 21 wherein forming a nucleation layer comprises forming an AlGaN layer by metal-organic chemical vapor deposition at a temperature between about 1080° and about 1165° C.

24. The method of claim 21 wherein the nucleation layer and one of the plurality of device layers are formed at a same temperature.

25. The method of claim 21 wherein:
    the substrate has a wurtzite crystal structure;
    providing a substrate comprises preparing a surface of the substrate having an orientation tilted between 0° and 5° from the {0001} direction of the wurtzite crystal structure; and
    forming a nucleation layer comprises forming the nucleation layer on said surface of the substrate.

26. The method of claim 21 wherein:
    the substrate has a wurtzite crystal structure;
    providing a substrate comprises preparing a surface of the substrate having an orientation tilted from the {0001} direction of the wurtzite crystal structure at an angle selected from the group consisting of about 30° to about 50°, about 80° to about 100°, and about 130° to about 150°; and
    forming a nucleation layer comprises forming the nucleation layer on said surface of the substrate.

* * * * *